United States Patent [19]
Nguyen

[11] Patent Number: 5,661,411
[45] Date of Patent: Aug. 26, 1997

[54] FEEDBACK CONTROLLED LOAD LOGIC CIRCUIT

[75] Inventor: Huy S. Nguyen, Fremont, Calif.

[73] Assignee: Fujitsu Microelectronics, Inc., San Jose, Calif.

[21] Appl. No.: 583,812

[22] Filed: Jan. 5, 1996

[51] Int. Cl.⁶ ................................ H03K 17/16
[52] U.S. Cl. .................. 326/21; 326/17; 326/34; 326/121
[58] Field of Search ................ 326/17, 21, 31, 326/34, 103, 106, 108, 121

[56] References Cited

U.S. PATENT DOCUMENTS

| | | | |
|---|---|---|---|
| 4,985,647 | 1/1991 | Kawada | 326/108 X |
| 5,300,839 | 4/1994 | Kawahara et al. | 365/203 X |
| 5,341,042 | 8/1994 | Chen | 326/21 |
| 5,382,844 | 1/1995 | Knauer | 326/108 X |
| 5,432,463 | 7/1995 | Wong et al. | 326/108 X |

Primary Examiner—David R. Hudspeth
Attorney, Agent, or Firm—Christie, Parker & Hale, LLP

[57] ABSTRACT

A logic circuit employing feedback controlled loads to increase the response time and minimize power consumption. A plurality of input circuits are provided, each having means for coupling a first signal to a second signal. A first load responsive to the second signal provides a means for pulling up the first signal and a second load responsive to the first signal provides a means for pulling down the second signal. A driver responsive to the first and second signals is provided for generating an output voltage.

20 Claims, 6 Drawing Sheets

FEEDBACK CONTROLLED LOAD LOGIC CIRCUIT

FIELD OF INVENTION

The present invention relates to logic circuits and more specifically to static logic circuits having multiple input capability with fast response time.

BACKGROUND OF THE INVENTION

Digital systems are used extensively in a vast array of applications including computation, data processing, control systems, communications, imagery and the like. These digital systems are generally constructed through the interconnection of standard logic circuits, each of which performs arithmetic or information control functions.

The logic circuit is generally a two-state device; that is, the output can assume only two different discrete values in response to voltage inputs corresponding to binary levels of "0" and "1". The conventional logic circuit is implemented using standard analog devices such as resistors, diodes and transistors integrated onto a single substrate to form gates, flip-flops, and other logic functions.

One of the most widely used logic circuits is an inverter. A simple inverter can be constructed using an n-channel enhancement mode Metal Oxide Semiconductor Field Effect Transistor (MOSFET) formed with a p-type substrate. In this embodiment, the drain is connected through a load to a power source and the source is connected to ground. The gate serves as the inverter input.

In operation, when a positive threshold voltage is applied to the gate, a conductive channel is formed between the source and drain providing a low impedance path between the load and ground. Conversely, when the gate voltage is below the threshold voltage, no conductive channel is formed and the load is pulled up toward the power source voltage.

Using the inverter as a basic building block, more complicated logic circuits can be constructed. By way of example, a three input NOR gate can be implemented by connecting three n-channel enhancement mode MOSFETs in parallel with the drains pulled-up to the power source through the load and the sources connected to ground. A low impedance path is created between the load and ground when a positive threshold voltage is applied to the gate of any one of the MOSFETs. Conversely, when all gate inputs are below the threshold voltage with respect to the source, the load output is pulled-up toward the power source voltage.

This implementation, however, suffers from several serious drawbacks. First, the low level voltage level ($V_{OL}$) varies depending on the number gate inputs exceeding the threshold voltage. As the number of conductive channels increase, the impedance path from the load to ground correspondingly decreases resulting in a lower output voltage. The lower output voltage results in an increased rise time when the gate inputs are simultaneously switched to a voltage level below the threshold because the output has to swing over a larger voltage range. Moreover, the power consumption increases as more conductive channels are induced since a larger current is drawn through the lower impedance path.

Second, since the conductance of the load does not decrease in any substantial amount in response to the gate inputs to the MOSFETs, the load reduces the fall time of the output when a threshold voltage is applied to any of the MOSFET devices. Conversely, when the gate inputs to all the MOSFETs are below the threshold voltage, the rise time suffers because the conductance of the load does not correspondingly increase. Hence, the conventional logic circuits are simply too slow for many high speed applications.

Accordingly, a current need exists for a logic circuit which has a substantially constant low level output voltage $V_{OL}$ independent of the number of gate inputs which exceed the threshold voltage. Moreover, it is desirable that this logic circuit have a fast response time and reduced power consumption than other conventional logic circuits.

SUMMARY OF THE INVENTION

An embodiment of the present invention is a feedback controlled load logic circuit that reduces the problems associated with the prior art. A driving circuit produces an output signal in response to a first and second input. A logic control circuit having at least one input switching circuit is coupled between the first and second inputs. A first controllable conductance circuit having a control input coupled to the second input couples the first input to a signal potential and a second controllable conductance having a control input coupled to the first input couples the second input to another signal potential.

In an alternative embodiment, an input circuit couples a first signal to a second signal in response to an input voltage. A first load is coupled between a power source and the first signal and has a conductance corresponding to the second signal. A second load is coupled between the power source return and the second signal and has a conductance corresponding to the first signal. A driver is provided for generating an output voltage as a function of the first and second signals.

Preferably, the first load is a p-channel FET having the drain coupled to the first signal, the source coupled to the power source and the gate coupled to the second signal. Similarly, the second load is preferably an n-channel FET having the drain coupled to the second signal, the source coupled to the power source return and the gate coupled to the first signal.

An attractive feature of one embodiment of the present invention utilizing FET loads is that the conductances of the loads are reduced when the input circuit connects the drains of the two loads together. This reduction in conductances has the effect of reducing the static currents, and hence reducing the overall power consumption. Moreover, this reduced conductance speeds up the coming together of the voltages of the drains thereby reducing the switching time of the circuit. Conversely, when the input circuit isolates the first and second signals, the conductances of both loads increase as the voltage on the drains separate thus increasing the speed of separation. Moreover, when the first and second signals are isolated there is effectively no static current flow through the loads.

BRIEF DESCRIPTION OF THE DRAWINGS

These and other features, aspects, and advantages of the present invention will become better understood with regard to the following description, appended claims, and accompanying drawings, wherein:

DETAILED DESCRIPTION

Figure 1:
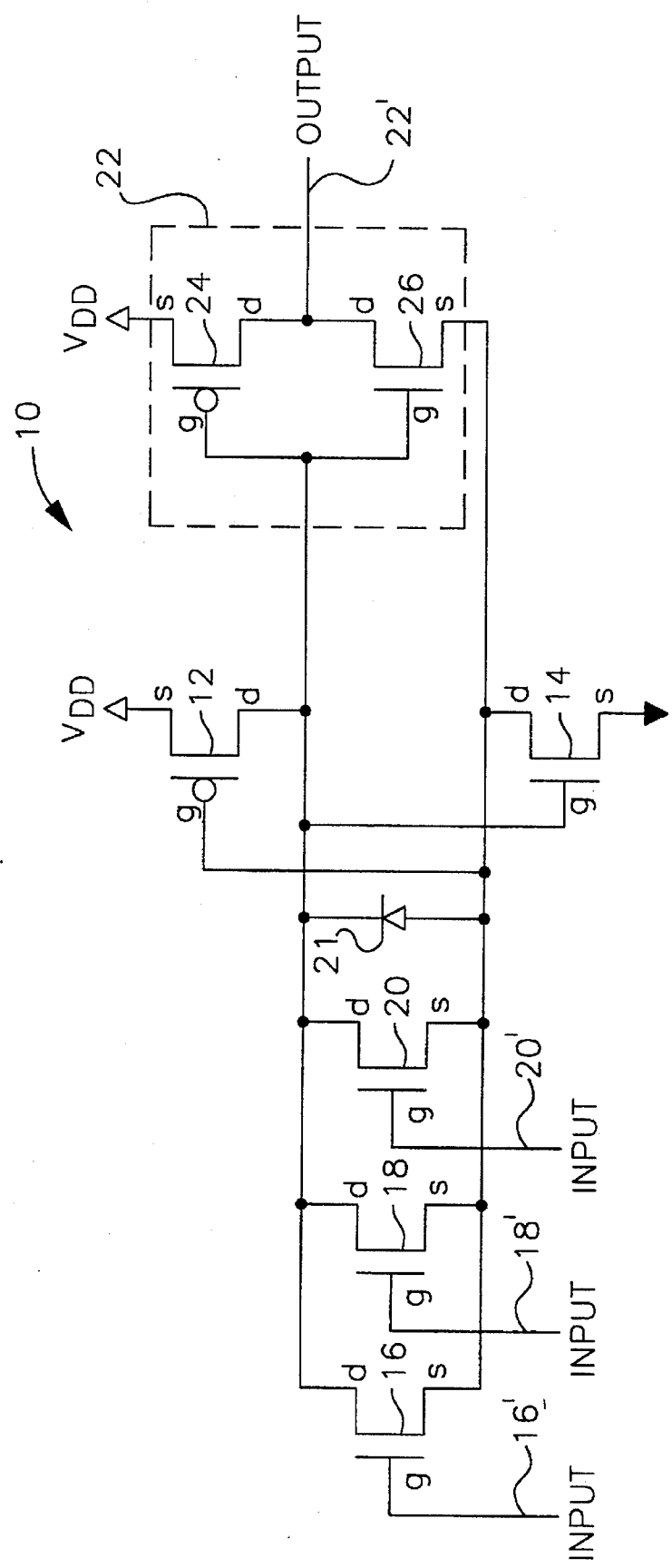
FIG. 1 is a schematic of an embodiment of the present invention illustrating a feedback controlled "OR" circuit.

According to an embodiment of the present invention, a feedback controlled load logic "OR" circuit 10 is shown in FIG. 1. The "OR" circuit comprises a p-channel enhancement mode MOSFET load 12 and an n-channel enhancement mode MOSFET load 14, although, it will be appreciated by one of ordinary skill in the art that other load circuits may be also used, including junction FETs (JFETs), metal-semiconductor FETs (MESFETs), bipolar transistors and the like. In the described embodiment, the p-channel MOSFET load 12 is used as a pull-up device having its source (s) tied to a power source ($V_{DD}$) with its gate (g) connected the drain (d) of the n-channel MOSFET load 14. The n-channel MOSFET load 14 is used as a pull-down device having its source (s) tied to the power source return, preferably ground (GND), with its gate (g) connected to the drain (d) of the p-channel MOSFET load 12. This feedback loop will be shown to reduce the power consumption of the "OR" circuit and increase the overall speed of the circuit.

Three n-channel MOSFET inputs 16, 18, 20 are shown, although any number MOSFET inputs may also be used. The MOSFET inputs 16, 18, 20 are connected in parallel with their sources connected to the drain of the n-channel MOSFET load 14 and their drains connected to the drain of the p-channel MOSFET load 12. The gates of the MOSFET inputs 16, 18, 20 provide three isolated inputs to the feedback controlled load logic circuit 10. These MOSFET inputs are particularly attractive due to their high input impedance, low static power dissipation and low costs, however, it will be apparent to those skilled in the art that other transmission gates or electrical switches capable of providing a low impedance connection between the drains of MOSFET loads 12, 14 may be used.

An initialization diode 21 ensures proper operation when power is initially applied. The cathode of the initialization diode 21 is connected to the drain of the p-channel MOSFET load 12 and the anode is connected to the drain of the n-channel MOSFET load 14, however, it will be appreciated by one of ordinary skill in the art that the initialization diode can be constructed in a variety of ways including an n-channel MOSFET and a p-channel MOSFET as shown in FIGS. 2 and 3 respectively.

Figure 2:
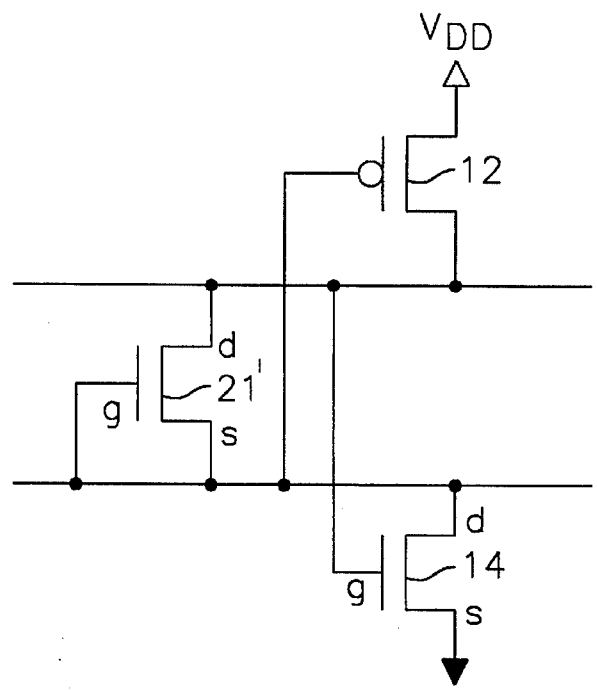
FIG. 2 is a schematic of an embodiment of the present invention illustrating an n-channel MOSFET initialization diode.
Figure 3:
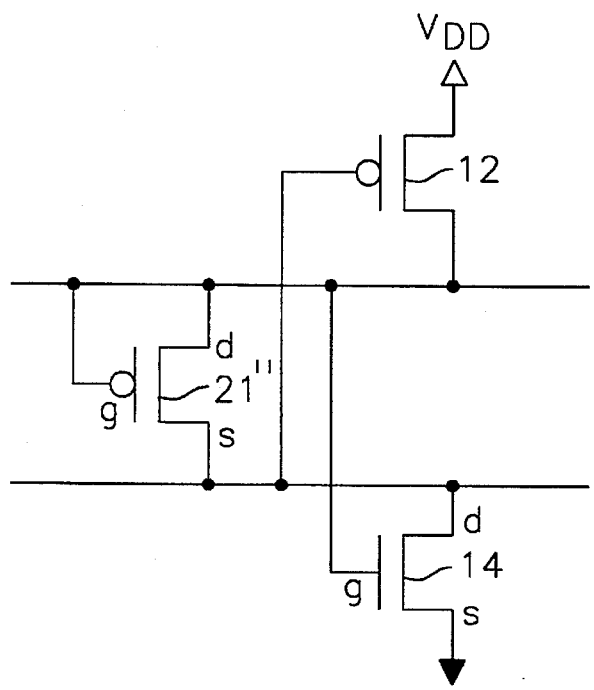
FIG. 3 is a schematic of an embodiment of the present invention illustrating a p-channel MOSFET initialization diode.

The n-channel MOSFET initialization diode 21' in the alternative embodiment of FIG. 2 has both its gate and drain connected to the drain of the n-channel MOSFET load 14 and its source connected to the drain of the p-channel MOSFET load 12. The p-channel MOSFET initialization diode 21" in the alternative embodiment of FIG. 3 has both its gate and its drain connected to the drain of the p-channel MOSFET load 12 and its source connected to the drain of the n-channel MOSFET load 14.

Returning to FIG. 1, the drain outputs of the MOSFET loads 12, 14 are connected to an output driver, such as a complimentary MOSFET (CMOS) circuit 22. The CMOS circuit 22 consists of two stacked MOSFET drivers, the upper transistor being a p-channel enhancement mode MOSFET 24 and the lower transistor being n-channel enhancement mode MOSFET 26. The drain of the p-channel MOSFET load 12 is connected to the gate inputs of both MOSFET drivers 24, 26. The drain of the n-channel MOSFET load 14 is connected to the source of the n-channel MOSFET driver 26 and the source of the p-channel MOSFET driver 24 is connected to $V_{DD}$. The drains of the MOSFET drivers 24, 26 are connected together to provide both current source and current sink drive capability.

In operation, an input signal having either a low level voltage ($V_{IL}$) or a high level voltage ($V_{IH}$) is applied to each of the MOSFET inputs 16, 18, 20. When referring to n-channel devices, $V_{IL}$ is defined herein as a voltage below the threshold voltage ($V_{tn}$) of the n-channel device and $V_{IL}$ is defined herein as a voltage above $V_{tn}$ of the n-channel device. When referring to p-channel devices, $V_{IL}$ is defined herein as a voltage below ($V_{DD}-|V_{tp}|$) where $|V_{tp}|$ is the absolute value of the threshold voltage of the p-channel device and $V_{IH}$ is defined herein as a voltage above ($V_{DD}-|V_{tp}|$). When a $V_{IL}$ signal is applied to all input lines 16', 18', 20', no conduction channel is induced between the drains of the MOSFET loads 12, 14 resulting in electrical isolation therebetween. In this case, the drain of the p-channel MOSFET load 12 is pulled up through its conduction channel to $V_{DD}$, and conversely, the drain of the n-channel MOSFET load 14 is pulled down through its conduction channel to GND.

The initialization diode 21 ensures that a conduction channel is induced in both the MOSFET loads 12, 14 on power-up. For ease of discussion, a MOSFET device having an induced conduction channel shall be hereinafter referred to as being in the "on" state, and conversely, a MOSFET device which has not been biased to induce a conduction channel shall be hereinafter referred to as being in the "off" state. The initialization diode 21 prevents the drain of the p-channel MOSFET load 12 from drifting toward GND and simultaneously the drain of the n-channel MOSFET load 14 from drifting toward $V_{DD}$, which in turn would reverse bias the gate to source junctions of the MOSFET loads 12, 14 causing improper operation of the feedback controlled load logic circuit 10 during start-up. Once the drains of the MOSFET loads 12, 14 begin to drift toward GND and $V_{DD}$ respectively, the initialization diode 21 begins to conduct, clamping the drains of the MOSFET loads together and thereby creating a forward bias on the gate to source junctions of each MOSFET load 12, 14 and forcing them into the "on" state.

Once the MOSFET loads 12, 14, in the feedback circuit are "on", the feedback holds the MOSFET loads 12, 14 in the "on" state as follows. $V_{DD}$ is applied to the gate of the n-channel MOSFET load 14 through the p-channel MOSFET load 12 forward biasing its gate to source junction and thereby maintaining the n-channel MOSFET load 14 in the "on" state. Similarly, GND is applied to the gate of the p-channel MOSFET load 12 through the n-channel MOSFET load 14 forward biasing the gate to source junction and thereby maintaining the p-channel MOSFET load 12 in the "on" state. As a result, a low impedance path is created between $V_{DD}$ and the gates of the MOSFET drivers 24, 26 forward biasing its gate to source junction of the n-channel MOSFET 26 driver forcing it into the "on" state. The threshold voltage necessary to forward bias the gate to source junction of the p-channel MOSFET driver 24 is not achieved since $V_{DD}$ is applied to both the gate and the source and, accordingly, the p-channel MOSFET driver 24 is forced into the "off" state. As a result, the output of the feedback controlled load logic circuit 10 provides a current sink to GND to an external load (not shown) connected to the output 22' through the n-channel MOSFET driver 26 and the n-channel MOSFET load 14.

In the event a $V_{IH}$ signal is applied to any input line 16', 18', 20' of the MOSFET inputs 16, 18, 20, respectively, a conduction channel between the drains of the p-channel MOSFET load 12 and the n-channel MOSFET load 14 is established. The MOSFET loads 12, 14 act as a voltage divider network producing a voltage at the drains of $V_d$. The level of $V_d$ depends upon the size of the gates of the MOSFET loads 12, 14 and the construction of the MOSFET inputs 16, 18, 20. Specifically, $V_d$ depends on the ratio $(W_p/L_p)/(W_n/L_n)$, where $W_p$ is the gate width and $L_p$ is the gate length of the p-channel MOSFET 12, and $W_n$ is the gate width and $L_n$ is the gate length of the n-channel MOSFET load 14. The maximum and minimum levels of $V_d$ are controlled by the feedback circuit which forces $V_m < V_d < (V_{DD} < |V_{tp}|)$. To illustrate this principle, consider the case where $V_d > (V_{DD} - |V_{tp}|)$. The p-channel MOSFET load 12 is forced into the "off" state because the gate to source voltage greater than $-|V_{tp}|$. However, the n-channel MOSFET load 14 is forced into the "on" state because the gate to source voltage exceeds $V_{tn}$. Consequently, based on the high impedance path of the p-channel MOSFET load 12 in series with the low impedance path of the n-channel MOSFET load 14, the drain voltage is loaded down toward GND until $V_d$ drops below $(V_{DD} - |V_{tp}|)$ where a voltage divider network is established in accordance with the characteristic transconductance of the MOSFET loads 12, 14 and the physical construction of the MOSFET inputs 16, 18, 20. Conversely, where $V_d < V_{tn}$ the n-channel MOSFET load 14 is forced into the "off" state because the gate to source voltage is below $V_{tn}$ of the n-channel device and the p-channel MOSFET load 12 is forced into the "on" state because the gate to source voltage is below $-|V_{tp}|$ causing the drain voltage to be pulled-up toward $V_{DD}$ until $V_d$ rises above $V_{tn}$ of the n-channel device.

The drain voltage $V_d$ is fed back to the gates of each MOSFET loads 12, 14 causing a slight forward bias between the gate to source junctions, inducing thereby a conductive channel having a lower transconductance than when the MOSFET loads are driven further into the "on" state. This reduction in transconductance speeds up the coming together of the voltages on the drains, and hence increases the switching response of the feedback controlled load logic circuit 10. Moreover, this reduced transconductance has the effect of reducing the static currents and thereby reduces the overall power consumption.

Preferably, the characteristic transconductance of the MOSFET loads 12, 14 are substantially identical and the effect of the MOSFET inputs 16, 18, 20 are negligible, forcing $V_d$ to approximately ½ the power source voltage, or $V_{DD}/2$. This embodiment will generally provide increased response time since neither drain of the MOSFET loads 12, 14 will need to swing over a larger voltage range than $V_{DD}/2$.

The MOSFET load drain voltage, $V_d$, is applied to the gates of the MOSFET drivers 24, 26 forward biasing the gate to source junction of the p-channel MOSFET driver 24 and forcing it into the "on" state. The threshold voltage necessary to forward bias the gate to source junction of the n-channel MOSFET driver 26 is not achieved because the gate and source are effectively short circuited through one or more of the MOSFET inputs 16, 18, 20 and, accordingly, the n-channel MOSFET 26 is forced into the "off" state. As a result, the output of the feedback controlled load logic circuit 10 provides a current source through the p-channel MOSFET driver 24 from $V_{DD}$ to the external load (not shown) connected to the output 22'.

Figure 4:
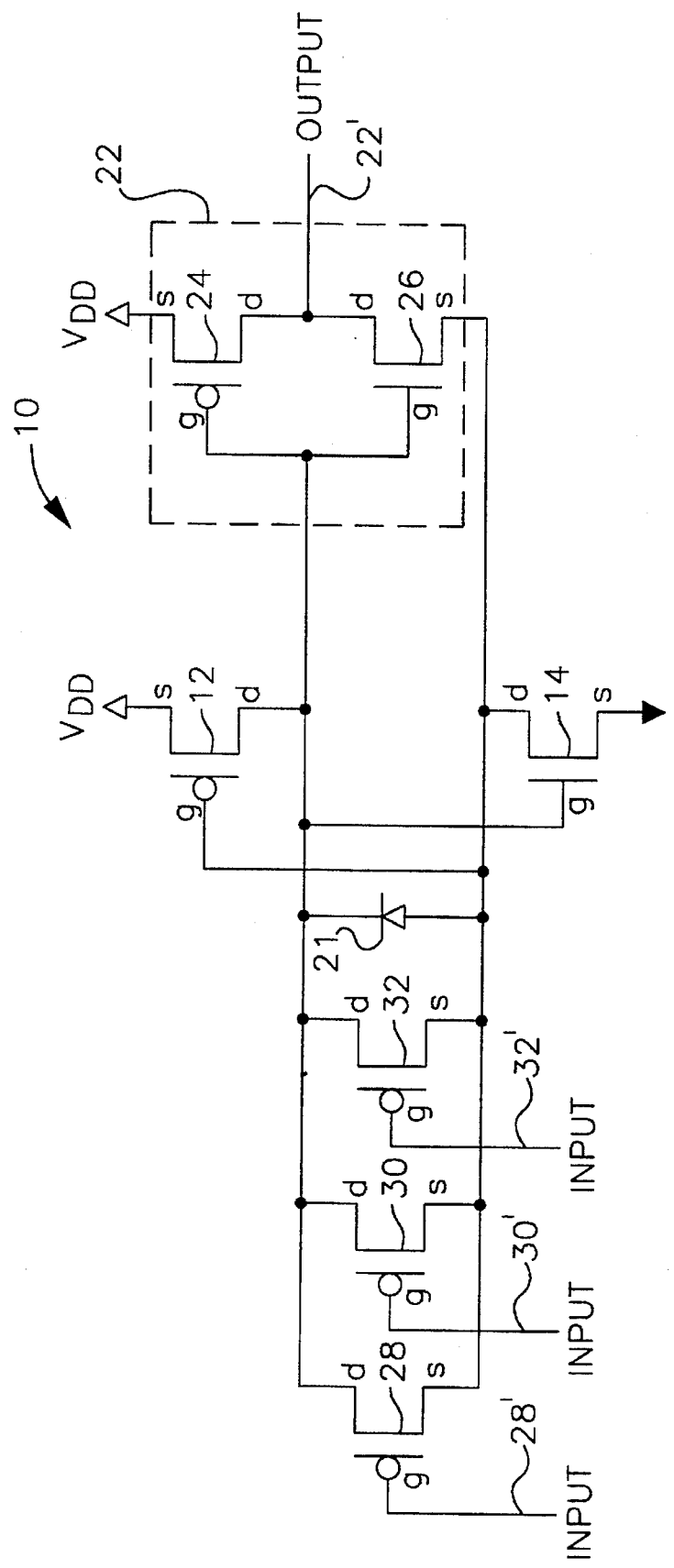
FIG. 4 is a schematic of an embodiment of the present invention illustrating a feedback controlled "NAND" circuit.

Turning to FIG. 4, a feedback controlled load "NAND" circuit in accordance with an alternative embodiment of the present invention is shown. The "NAND" circuit is preferably constructed using the same MOSFET loads 12, 14, MOSFET drivers 24, 26 and initialization diode 21. In the described embodiment, the n-channel MOSFET inputs 16, 18, 20 of FIG. 1 are replaced with p-channel MOSFET inputs 28, 30, 32. The MOSFET inputs 28, 30, 32 are connected in parallel with their sources connected to the drain of the p-channel MOSFET load 12 and their drains connected to the drain of the n-channel MOSFET load 14. A conduction channel is established between the drains of the MOSFET loads 12, 14 when a $V_{IL}$ signal is applied to one or more input lines, 28'30', 32' of the MOSFET inputs 28, 30, 32.

As described in detail above, once a conduction channel is established between the drains of the MOSFET loads 12, 14, a voltage divider network is created producing a voltage of $V_d$ at their drains. The drain voltage is applied to the gate inputs of the MOSFET drivers 24, 26 forcing the p-channel MOSFET driver 24 into the "on" state and the n-channel MOSFET driver 26 into the "off" state resulting in a current source from $V_{DD}$ to the external load (not shown) connected to the output 22'.

Conversely, when a $V_{IH}$ is applied to all the input lines 28', 30' 32', no current channel is induced between the drains of the MOSFET loads 12, 14 causing the drain of the p-channel MOSFET load 12 to be pulled up to $V_{DD}$ and the drain of the n-channel MOSFET load 14 to be pulled down to GND. The drain voltage of the p-channel MOSFET load 12 is fed to the gate inputs of the MOSFET drivers forcing the p-channel MOSFET driver 24 into the "off" state and the n-channel MOSFET driver 26 into the "on" state resulting in a current sink for the external load (not shown) connected to the output 22'.

Figure 5:
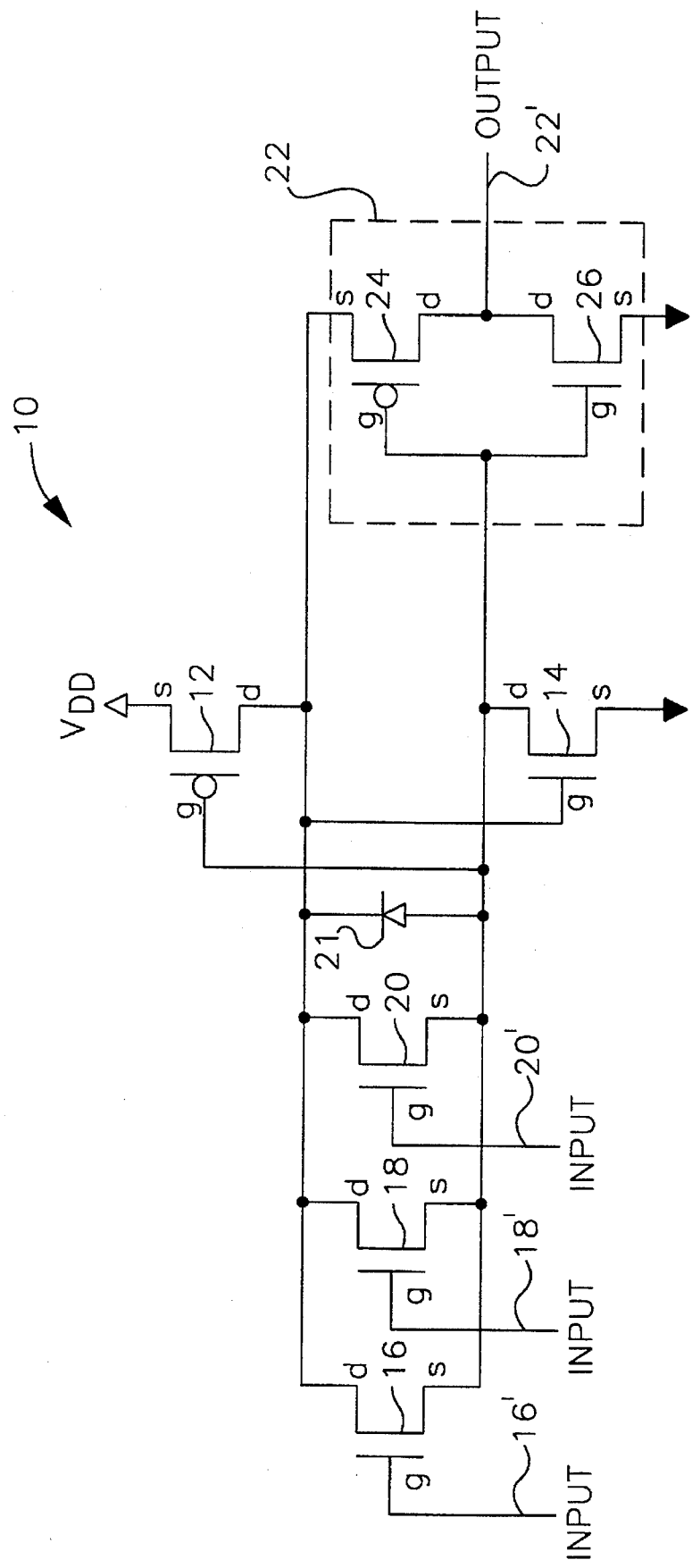
FIG. 5 is a schematic of an embodiment of the present invention illustrating a feedback controlled "NOR" circuit.

Turning to FIG. 5, a feedback controlled load "NOR" circuit in accordance with an alternative embodiment of the present invention is shown. This circuit is constructed using the same n-channel MOSFET inputs 16, 18, 20, MOSFET loads 12, 14, MOSFET drivers 24, 26, and initialization diode 21 as described in FIG. 1 for the "OR" circuit embodiment, except that the interconnection between the MOSFET loads 12, 14 and the MOSFET drivers 24, 26 are altered. The drain of the n-channel MOSFET load 14 is connected to the gates of the MOSFET drivers 24, 26 and the drain of the p-channel MOSFET load 12 is connected to the source of the p-channel MOSFET driver 24. The source of the MOSFET driver 26 is connected to GND and the drains of the MOSFET drivers 24, 26 are connected together to provide current source and current sink drive capability.

The operation of this embodiment is substantially identical to that of the "OR" circuit embodiment of FIG. 1, except that the output 22' is inverted. Accordingly, when a $V_{IL}$ signal is applied to all input lines 16', 18', 20', the drain of the p-channel MOSFET load 12 is pulled up to $V_{DD}$, and the drain of the n-channel MOSFET load 14 is pulled down to GND. The GND signal is applied to the gate inputs of the MOSFET drivers 24, 26 through the low impedance conduction channel of the n-channel MOSFET load 14 forward biasing the gate to source junction of the p-channel MOSFET driver 24 and forcing it into the "on" state. The threshold voltage necessary to forward bias the gate to source junction of the n-channel MOSFET driver 26 is not obtained since both the gate and source are coupled to GND. As a result, the output of the feedback controlled load logic circuit provides a current source through the p-channel MOSFET driver 24 from $V_{DD}$ to the external load (not shown) connected to the output 22'.

As described in detail above in connection with the "OR" circuit embodiment of FIG. 1, a conduction channel is established between the drains of the MOSFET loads 12, 14, when a $V_{IH}$ is applied to any input line 16', 18', 20', resulting in a voltage divider network between the MOSFET loads 12, 14 and producing a voltage of $V_d$ at their drains. The drain voltage of the MOSFET loads 12, 14 is applied to the gates of the MOSFET drivers 24, 26 causing the gate to source junction of the n-channel MOSFET driver 26 to be forward biased and forcing it into the "on" state. The p-channel MOSFET driver 24 has effectively a short circuit applied across the gate and source through the low impedance conduction channel of one or more of the MOSFET inputs 16, 18, 20 and therefore is forced into the "off" state. Accordingly, the feedback controlled logic circuit provides a current sink to GND for the external load (not shown) connected to the output 22'.

Figure 6:
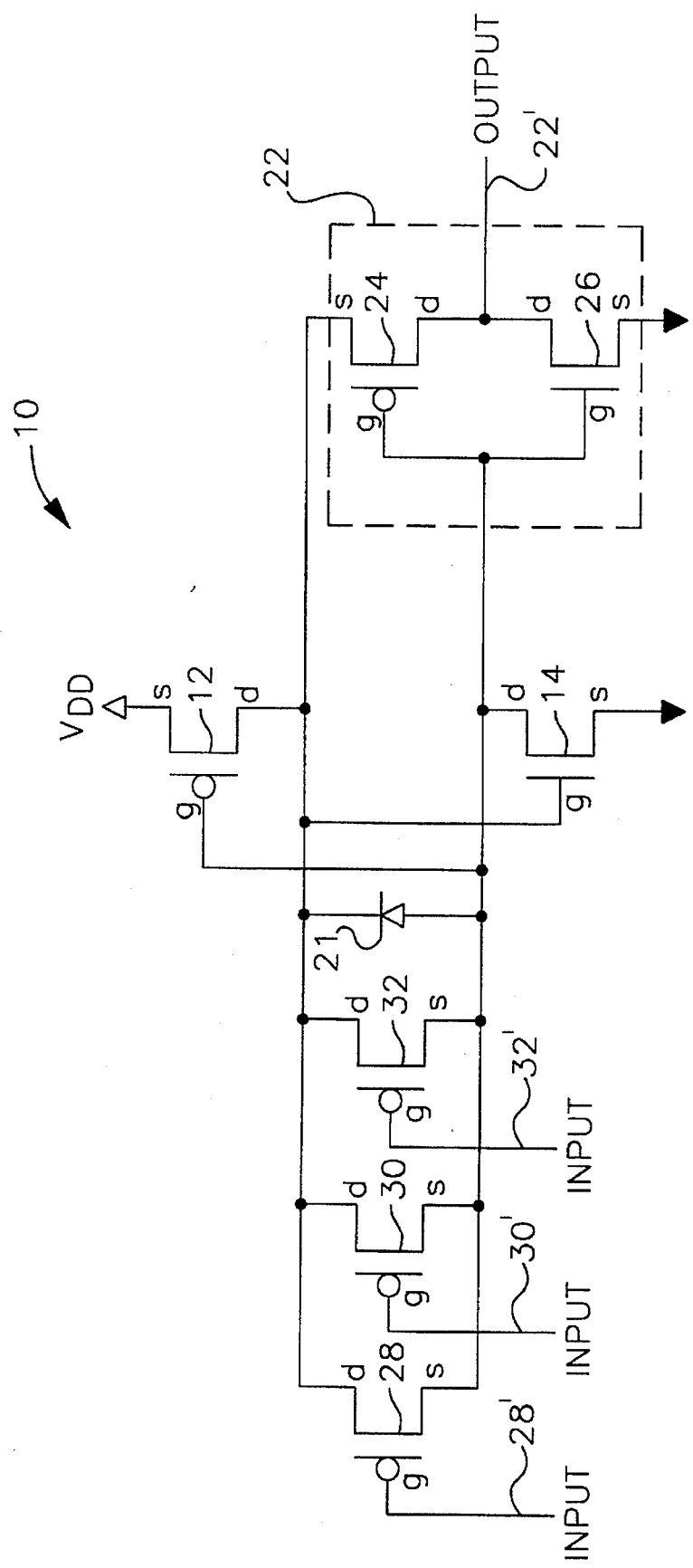
FIG. 6 is a schematic of an embodiment of the present invention illustrating a feedback controlled "AND" circuit.

Turning to FIG. 6, a feedback controlled load "AND" circuit in accordance with an alternative embodiment of the present invention is shown. The "AND" circuit is preferably constructed using the same p-channel MOSFET inputs 28, 30, 32, MOSFET loads 12, 14, MOSFET drivers 24, 26, and initialization diode 21 as described in FIG. 4 for the "NAND" circuit embodiment, except that the interconnection between the MOSFET loads 12, 14 and the MOSFET drivers 24, 26 is the same as described for the "NOR" circuit embodiment depicted in FIG. 5.

In the described embodiment, a conduction channel is established between the drains of the MOSFET loads 12, 14 when a $V_{IL}$ signal is applied to any input line 28', 30', 2' of the MOSFET inputs 28, 30, 32, respectively, forcing the MOSFET load drains to approximately $V_d$. The drain voltage is fed to gates of the MOSFET drivers 24, 26 forcing the p-channel MOSFET driver 24 into the "off" state and the n-channel MOSFET driver 26 into the "on" state, and thereby resulting in a current sink to GND for the external load (not shown) connected to the output 22'.

Conversely, when a $V_{IH}$ signal is applied to all the input lines 28', 30', 32', no current channel is induced and the drain of the p-channel MOSFET load 12 is pulled up to $V_{DD}$ and the drain of the n-channel MOSFET load 14 is pulled down to GND. The drain voltage of the n-channel MOSFET load 14 is applied to both gates of the MOSFET drivers 24, 26 forcing the p-channel MOSFET driver 24 into the "on" state and the n-channel MOSFET driver 26 into the "off" state. As a result, a current source between $V_{DD}$ and the external load (not shown) connected to the output 22' is established.

Figure 7:
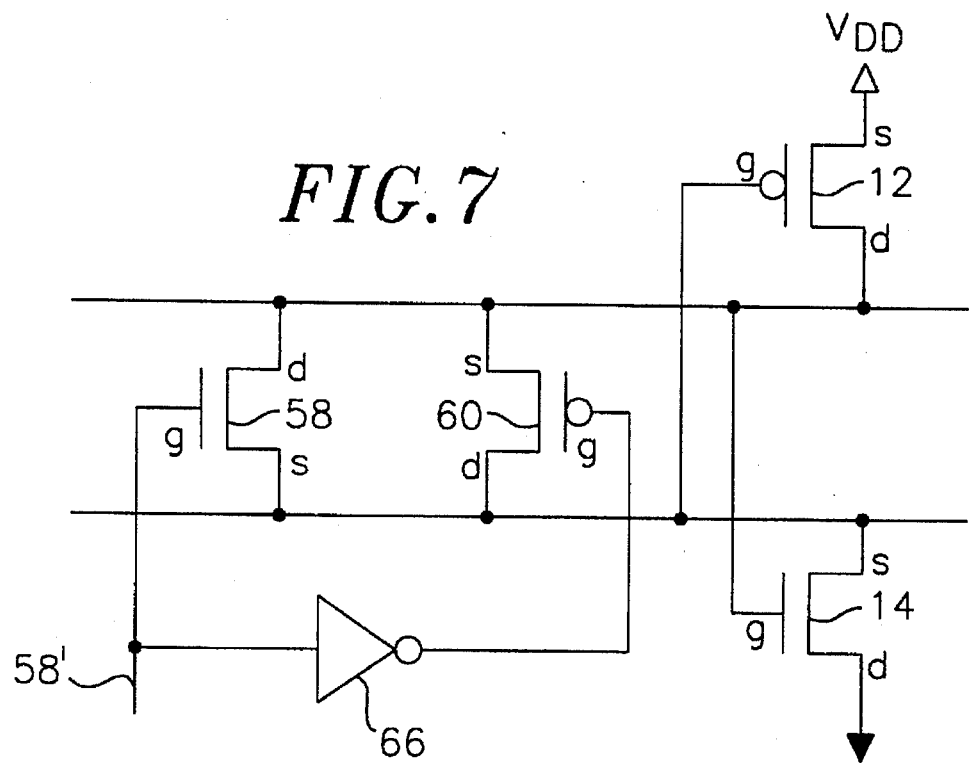
FIG. 7 is a schematic of an embodiment of the present invention illustrating a CMOS input for an "OR" and "NOR" circuit.

Turning to FIG. 7, an alternative embodiment using CMOS inputs is shown suitable for use in the "OR" and "NOR" circuit embodiments depicted in FIGS. 1 and 5 respectively. The use of CMOS inputs provides the added benefit of reducing the circuits sensitivity to process fluctuations between the p-doped and n-doped devices since the CMOS input uses both a p-channel and an n-channel MOSFET connected in parallel to couple the drains of the MOSFET loads together.

In the described embodiment, the n-channel MOSFET input 58 is connected in parallel with a p-channel MOSFET input 60 wherein the source of the n-channel MOSFET input 58 is connected to the drain of the p-channel MOSFET input 60 and the drain of the n-channel MOSFET input 58 is connected to the source of the p-channel MOSFET input 60. The input signal is coupled directly to the gate of the n-channel MOSFET input 58. An inverter 66 is employed to provide an inverted input signal to the gate of the p-channel MOSFET input 60.

In operation, a $V_{IH}$ signal at an input line 58' forward biases the gate to source junction of the n-channel MOSFET input 58 forcing it into the "on" state. The input signal is applied to the inverter 66 which generates an output voltage at $V_{IL}$ at the gate of the p-channel MOSFET input 60, forwarding biasing the gate to source junction and forcing it into the "on" state.

Conversely, a $V_{IL}$ signal at the input line 58' is applied to the gate input of the n-channel MOSFET input 58 forces it into the "off" state. The input signal is applied to the inverter 66 generates an output voltage at $V_{IH}$ at the gate of the p-channel MOSFET input 60 forcing it into the "off" state.

Figure 8:
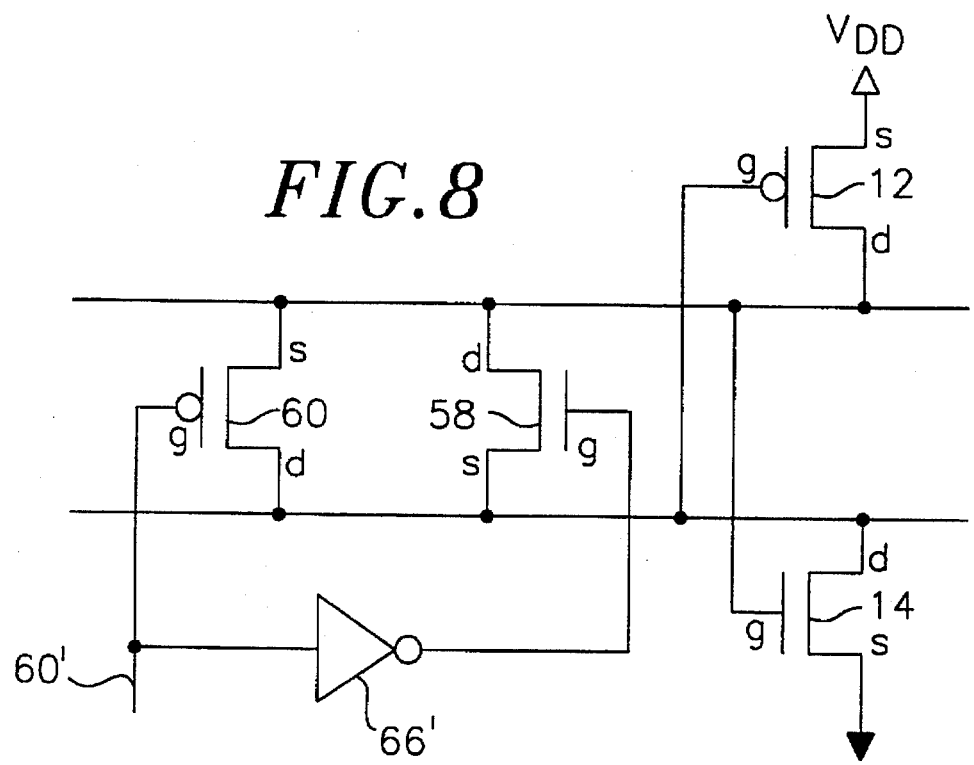
FIG. 8 is a schematic of an embodiment of the present invention illustrating a CMOS input for an "AND" and "NAND" circuit.

Similarly, FIG. 8 illustrates an embodiment of the present invention employing a CMOS input suitable for use in the "NAND" and "AND" circuit embodiments depicted in FIGS. 4 and 6, respectively. In this embodiment, the CMOS input can be constructed by merely switching the gate connections of the n-channel MOSFET input 58 with the p-channel MOSFET input 60 of FIG. 7. In other words, the input signal is connected to the gate of the p-channel MOSFET input 60 and the inverter 66 is used to drive the gate input of the n-channel MOSFET input 58.

It is apparent from the foregoing that an embodiment of the present invention satisfies an immediate need for a logic circuit having a constant low level output voltage, increased response time and reduced power consumption. An embodiment of the present invention satisfies this need by providing a feedback controlled load logic circuit. This feedback controlled load logic circuit may be used for other logic functions, including but not limited to, flip-flops, latches, registers, comparators, counters, memories, multiplexers, demultiplexers, encoders, decoders, adders, subtractors, multipliers, dividers, oscillators, one-shots, buffers, inverters, schmidt triggers and the like without departing from the spirit or essential attributes of the present invention. It is therefore desired that the present embodiment be considered in all respects as illustrative and not restrictive, reference being made to the appended claims rather than the foregoing description to indicate the scope of the invention.

What is claimed is:

1. A controlled logic circuit comprising:
    a driving circuit comprising first and second inputs and for producing an output responsive to signals at said first and second inputs;
    a logic control circuit comprising at least one input switching circuit coupled between the first and second inputs;
    a first controllable conductance circuit for coupling the first input to a signal potential and comprising a control input coupled to the second input; and
    a second controllable conductance circuit for coupling the second input to another signal potential and comprising a control input coupled to the first input.

2. The controlled logic circuit of claim 1 wherein said at least one input switching circuit comprises a plurality of said input switching circuits coupled in parallel across the first and second inputs.

3. The controlled logic circuit of claim 1 wherein each of said controllable conductance circuits comprises a transistor.

4. The controlled logic circuit of claim 1 wherein the driving circuit comprises a first transistor and a second transistor, each of said transistors having a gate coupled to the gate of the other transistor, said gates being coupled to one of said first and second inputs.

5. The controlled logic circuit of claim 4 wherein each of said first and second transistors further comprise a source, one of said sources being coupled to the other of one of said first and second inputs.

6. A feedback controlled load logic circuit responsive to an input voltage, said input voltage having a high level voltage and a low level voltage, comprising:

an input circuit for coupling a first signal to a second signal in response to one of said high level voltage and said low level voltage;

a first load coupled between the first signal and a power source, said first load having a conductance corresponding to a voltage of said second signal;

a second load coupled between the second signal and a power source return, said second load having a conductance corresponding to a voltage of said first signal; and a driver for generating an output voltage as a function of the first and second signals.

7. The feedback controlled load logic circuit of claim 6 wherein said first load comprises a pull-up transistor and said second load comprises a pull-down transistor.

8. The feedback controlled load logic circuit of claim 7 wherein said pull-up transistor comprises a p-channel FET and said pull-down transistor comprises an n-channel FET.

9. The feedback controlled load logic circuit of claim 8 wherein said p-channel FET comprises a gate coupled to the second signal and said n-channel FET comprises a gate coupled to the first signal.

10. The feedback controlled load logic circuit of claim 9 wherein said p-channel FET comprises a drain coupled to the first signal and said n-channel FET comprises a drain coupled to the second signal.

11. The feedback controlled load logic circuit of claim 10 wherein said p-channel FET comprises a source coupled to the power source and said n-channel FET comprises a source coupled to the power source return.

12. The feedback controlled load logic circuit of claim 6 wherein said driver comprises a p-channel FET and an n-channel FET, each FET having a gate coupled to the gate of the other FET, said gates being coupled to one of said first and said second signals.

13. The feedback controlled load logic circuit of claim 12 wherein each of said FETs further comprise a source, one of said sources being coupled to the other of one of said first and second signals.

14. The feedback controlled load logic circuit of claim 6 wherein said input circuit comprises a p-channel FET having a drain and source, and an n-channel FET having a drain and source, the drain of the p-channel FET being coupled to the source of the n-channel FET and the source of the p-channel FET being coupled to the drain of the n-channel FET.

15. A feedback controlled load logic circuit coupled between a voltage source and a voltage source return, comprising:

generating means for generating a first and a second signal in response to an input voltage;

first limiting means for limiting a voltage swing of the first signal substantially between the voltage source and a voltage level in response to said second signal;

second limiting means for limiting a voltage swing of the second signal substantially between the voltage source return and said voltage level in response to said first signal; and a driver having an output responsive to said first and second signals, said output having a voltage swing substantially between the voltage source and the voltage source return.

16. The feedback controlled load logic circuit of claim 15 wherein said voltage level is substantially ½ the voltage source.

17. The feedback controlled load logic circuit of claim 15 wherein said first limiting means comprises a pull-up transistor and said second limiting means comprises a pull-down transistor.

18. The feedback controlled load logic circuit of claim 17 wherein said pull-up transistor comprises a p-channel FET and said pull-down transistor comprises an n-channel FET.

19. The feedback controlled load logic circuit of claim 18 wherein said p-channel FET comprises a gate coupled to the second signal and said n-channel FET comprises a gate coupled to the first signal.

20. The feedback controlled load logic circuit of claim 19 wherein said p-channel FET comprises a drain coupled to the first signal and said n-channel FET comprises a drain coupled to the second signal.

* * * * *

UNITED STATES PATENT AND TRADEMARK OFFICE
CERTIFICATE OF CORRECTION

PATENT NO. : 5,661,411
DATED : August 26, 1997
INVENTOR(S) : Huy S. Nguyen

It is certified that error appears in the above-indentified patent and that said Letters Patent is hereby corrected as shown below:

Column 4, line 22, change "$V_{IL}$" to -- $V_{IH}$ --.
Column 5, line 5, replace "$V_{DD}$is" with -- $V_{DD}$ is --.
Column 5, line 22, replace "MOSFET 12" with -- MOSFET 1OAD 12--.
Column 5, line 26, replace "($V_{DD}$<|$V_{tp}$|)" with -- ($V_{DD}$-|$V_{tp}$|) --.

Signed and Sealed this

Fourteenth Day of July, 1998

Attest:

BRUCE LEHMAN

*Attesting Officer*    *Commissioner of Patents and Trademarks*